(12) United States Patent
Chen et al.

(10) Patent No.: US 11,450,586 B2
(45) Date of Patent: Sep. 20, 2022

(54) HEAT DISSIPATION STRUCTURE, SEMICONDUCTOR PACKAGING DEVICE, AND MANUFACTURING METHOD OF THE SEMICONDUCTOR PACKAGING DEVICE

(71) Applicants: GLOBAL UNICHIP CORPORATION, Hsinchu (TW); TAIWAN SEMICONDUCTOR MANUFACTURING COMPANY, LTD., Hsinchu (TW)

(72) Inventors: Jia-Liang Chen, Hsinchu (TW); Chi-Ming Yang, Hsinchu (TW); Yen-Chao Lin, Hsinchu (TW)

(73) Assignees: GLOBAL UNICHIP CORPORATION, Hsinchu (TW); TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/219,913

(22) Filed: Apr. 1, 2021

(65) Prior Publication Data
US 2022/0262701 A1   Aug. 18, 2022

(30) Foreign Application Priority Data
Feb. 18, 2021   (TW) .................. 110105549

(51) Int. Cl.
*H01L 23/367* (2006.01)
*H01L 23/00* (2006.01)
(Continued)

(52) U.S. Cl.
CPC ...... *H01L 23/3675* (2013.01); *H01L 21/4882* (2013.01); *H01L 21/563* (2013.01); *H01L 23/3185* (2013.01); *H01L 23/3192* (2013.01); *H01L 23/3735* (2013.01); *H01L 24/13* (2013.01); *H01L 24/16* (2013.01); *H01L 24/17* (2013.01); *H01L 24/32* (2013.01); *H01L 24/33* (2013.01); *H01L 24/73* (2013.01); *H01L 24/92* (2013.01); *H01L 24/81* (2013.01); *H01L 2224/13025* (2013.01); *H01L 2224/16145* (2013.01); *H01L 2224/17181* (2013.01); *H01L 2224/17519* (2013.01); *H01L 2224/32145* (2013.01); *H01L 2224/33181* (2013.01); *H01L 2224/33519* (2013.01); *H01L 2224/73204* (2013.01); *H01L 2224/73253* (2013.01);
(Continued)

(58) Field of Classification Search
CPC ............ H01L 23/3675; H01L 21/4882; H01L 21/563
See application file for complete search history.

(56) References Cited

U.S. PATENT DOCUMENTS 8,183,578 B2    5/2012    Wang
10,483,187 B2   11/2019   Yu et al.
(Continued)

*Primary Examiner* — Errol V Fernandes
(74) *Attorney, Agent, or Firm* — CRC & Partners Co., LLC

(57) ABSTRACT

A semiconductor packaging device includes a wiring board, a working chip, a heat-dissipating metal lid and a silicon thermal conductivity element. The working chip is mounted on the wiring board, and in-built with an working circuit therein. The silicon thermal conductivity element is thermally coupled to the working chip and the heat-dissipating metal lid, and is electrically isolated from the working circuit and the wiring board.

9 Claims, 9 Drawing Sheets

(51) Int. Cl.
*H01L 21/48* (2006.01)
*H01L 23/373* (2006.01)
*H01L 21/56* (2006.01)
*H01L 23/31* (2006.01)

(52) U.S. Cl.
CPC ............. *H01L 2224/81815* (2013.01); *H01L 2224/92125* (2013.01); *H01L 2224/92225* (2013.01); *H01L 2224/92242* (2013.01); *H01L 2924/10253* (2013.01); *H01L 2924/10272* (2013.01)

(56) References Cited

U.S. PATENT DOCUMENTS

2003/0179549 A1* 9/2003 Zhong ................ H01L 23/4334
257/E23.092
2013/0082364 A1* 4/2013 Wang ................. H01L 25/0655
257/659
2020/0388549 A1* 12/2020 Kim .................... H01L 23/4334

* cited by examiner

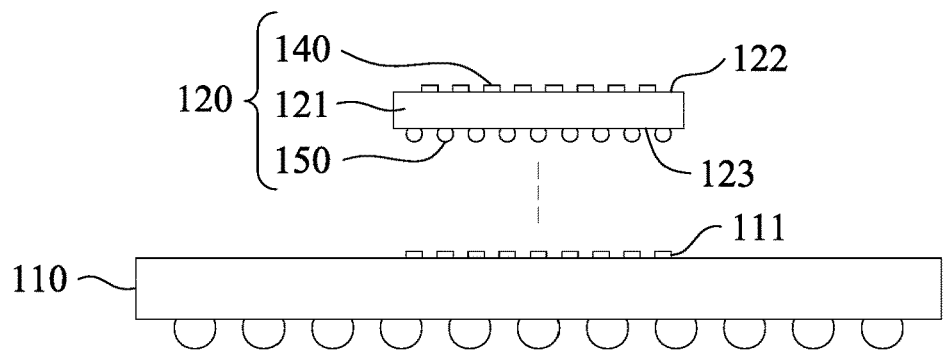
Fig. 6A
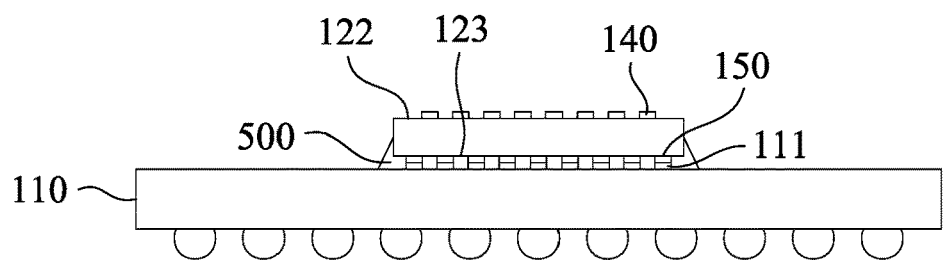
Fig. 6B
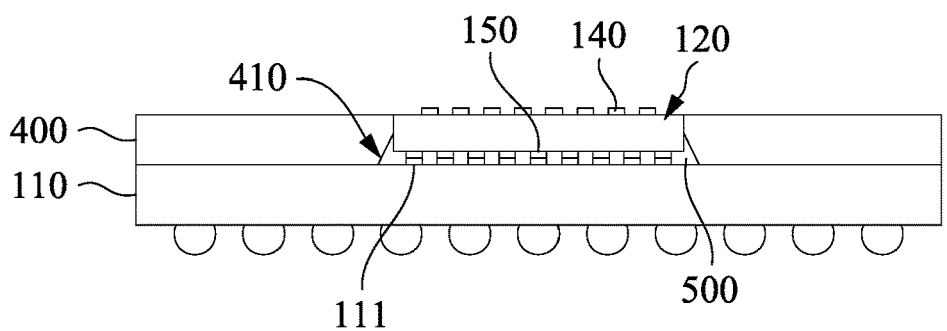
Fig. 6C

HEAT DISSIPATION STRUCTURE, SEMICONDUCTOR PACKAGING DEVICE, AND MANUFACTURING METHOD OF THE SEMICONDUCTOR PACKAGING DEVICE

RELATED APPLICATIONS

This application claims priority to Taiwan Application Serial Number 110105549, filed on Feb. 18, 2021, which is herein incorporated by reference.

BACKGROUND

Field of Disclosure

The present disclosure relates to a heat dissipation structure, a semiconductor packaging device, and a manufacturing method of the semiconductor packaging device.

Description of Related Art

As the volume of the semiconductor package modules starts to be miniaturized, the performance of the semiconductor package module is continuously enhanced, and with the higher heat generation, suitable heat dissipation technologies are required to effectively dissipate the heat.

However, the thermal conductivity of thermally-conductive materials commonly used in the semiconductor package modules is not high, so that the heat dissipation performance of related packages cannot be effectively improved. If there is no decent heat dissipation technologies for effectively removing the heat energy of the semiconductor package modules, the overall stability and product life of the semiconductor package module will be reduced.

Therefore, the above-mentioned method still has inconveniences and shortcomings, which needs to be further improved. Therefore, how to effectively solve the above-mentioned inconveniences and shortcomings is one of the current essential research and development topics, and it has also become an urgent need for improvement in related fields.

SUMMARY

One aspect of the present disclosure is to provide a heat dissipation structure, a semiconductor packaging device, and a manufacturing method of the semiconductor packaging device to solve the aforementioned problems of the prior art.

In one embodiment of the present disclosure, a heat dissipation structure is provided, and includes a heat-dissipating metal lid and a dummy silicon chip. The heat-dissipating metal lid includes a lid body and a recess portion. The recess portion is formed on one surface of the lid body for accommodating a heat source. The dummy silicon chip is mounted within the recess portion, such that one of two opposite sides of the dummy silicon chip is fixedly connected to the heat-dissipating metal lid, and the other of the opposite sides of the dummy silicon chip is thermally coupled to the heat source, and electrically isolated from the heat source.

In one embodiment of the present disclosure, a semiconductor packaging device is provided, and includes a wiring board, a working chip, a heat-dissipating metal lid and a silicon thermal conductivity element. The working chip includes a chip body and an working circuit. The chip body is fixedly mounted on the wiring board. The working circuit is inbuilt inside the chip body, and electrically connected to the wiring board. The silicon thermal conductivity element is thermally coupled to the chip body and the heat-dissipating metal lid, and electrically isolated from the working circuit and the wiring board.

In one embodiment of the present disclosure, a manufacturing method of a semiconductor packaging device is provided, and the manufacturing method includes step (a) to step (c) as follows. In step (a), a working chip is soldered on one surface of a wiring board so that an working circuit inbuilt inside a chip body of the working chip is electrically connected to the wiring board. In step (b), a silicon thermal conductivity element is soldered on one surface of a heat-dissipating metal lid. In step (c), the heat-dissipating metal lid is fixedly covered on the wiring board such that the silicon thermal conductivity element is sandwiched between the chip body and the heat-dissipating metal lid, and the silicon thermal conductivity element is electrically isolated from the working circuit of the chip body and the wiring board.

Thus, through the construction of the embodiments above, the present disclosure is able to improve the thermal conductivity of the thermal conductivity interface between the working chip and the heat-dissipating metal lid, so that the heat dissipation performance of the semiconductor packaging device can be effectively improved and thermal resistance of the semiconductor packaging device is reduced.

The above description is merely used for illustrating the problems to be resolved, the technical methods for resolving the problems and their efficacies, etc. The specific details of the present disclosure will be explained in the embodiments below and related drawings.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure.

FIG. 6A to FIG. 6I respectively are continuous operational schematic views of the manufacturing method of FIG. 5.

DESCRIPTION OF THE EMBODIMENTS

Figure 1:
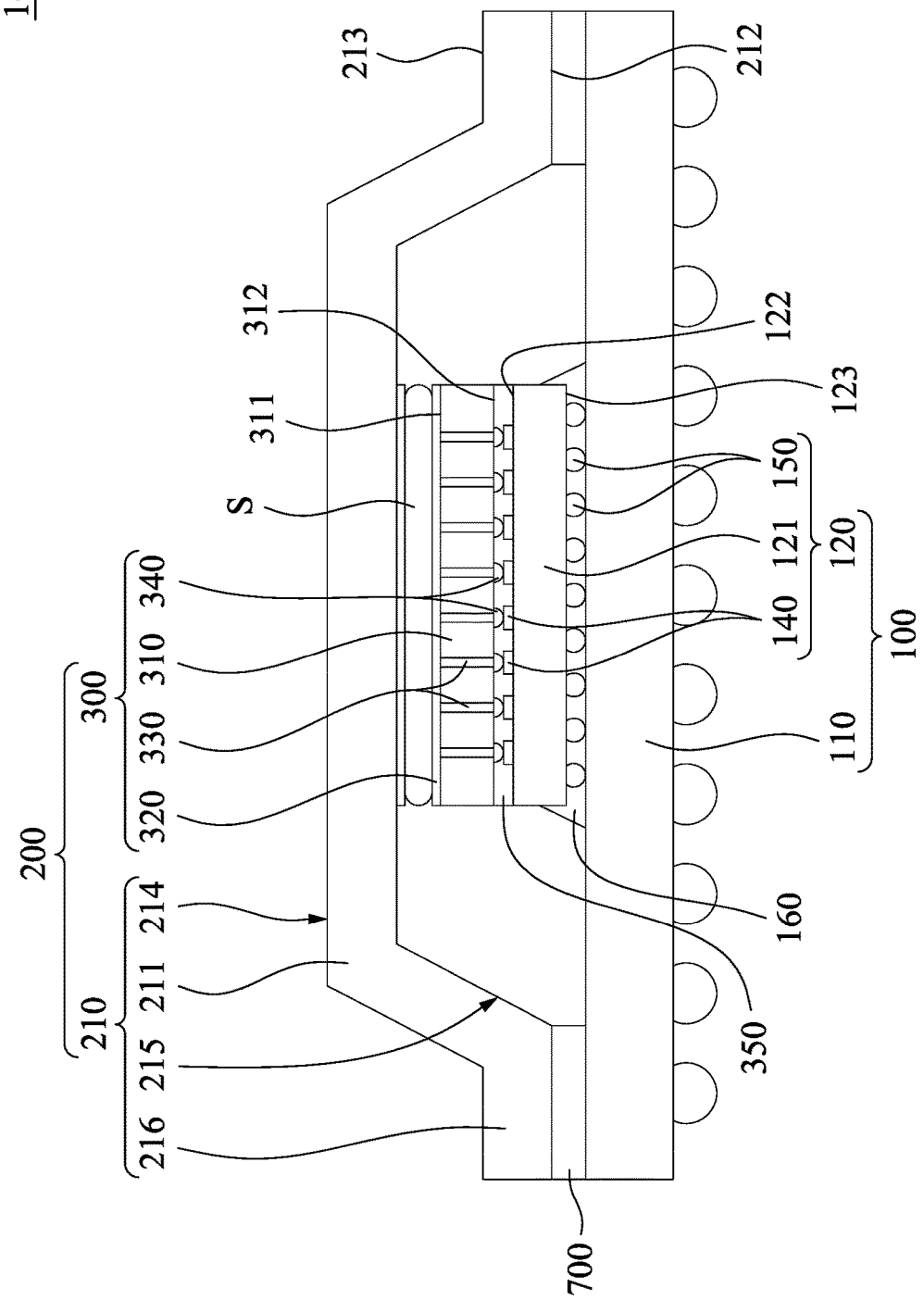
FIG. 1 is a schematic view of a semiconductor packaging device according to one embodiment of the present disclosure.

Reference will now be made in detail to the present embodiments of the present disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the present disclosure without departing from the scope or spirit of the present disclosure.

Reference is now made to FIG. 1, in which FIG. 1 is a schematic view of a semiconductor packaging device 10 according to one embodiment of the present disclosure. As shown in FIG. 1, the semiconductor packaging device 10 includes a heat source 100 and a heat dissipation structure 200. The heat dissipation structure 200 is used to remove high heat energy of the heat source 100. The heat source 100 includes a wiring board 110 and a working chip 120 (e.g., silicon chip). The working chip 120 includes a chip body 121, a packaging unit (not shown in figures), and at least one working circuit (not shown in figures). The chip body 121 is fixedly mounted on the wiring board 110, and the working circuit is inbuilt within the chip body 121 for transmitting signals in the chip body 121 so that the working chip 120 is able to operate normally. The packaging unit wraps the chip body 121 therein for protecting the chip body 121 and the working circuit. The heat dissipation structure 200 includes a heat-dissipating metal lid 210 and a silicon thermal conductivity element 300. The silicon thermal conductivity element 300 is thermally coupled to the working chip 120 and the heat-dissipating metal lid 210, and electrically isolated from the wiring board 110 and the working circuit of the chip body 121 totally. In other words, the silicon thermal conductivity element 300 may thermally exchange with the heat source 100, but the silicon thermal conductivity element 300 will not exchange electrical signals with the working chip 120. More specifically, the silicon thermal conductivity element 300 is soldered to the working chip 120 and the heat-dissipating metal lid 210. The heat-dissipating metal lid 210 is, for example, a high thermal conductivity metal plating layer. However, the present disclosure is not limited thereto.

The silicon thermal conductivity element 300 includes a silicon body 310, a thermally-conductive layer 320 and a plurality of thermal conduction channels 330. The silicon body 310 conducts the heat energy of the working chip 120 to the heat-dissipating metal lid 210. For example, the silicon body 310 includes silicon carbide (SiC), or the silicon body 310 is a well-known element such as a dummy silicon chip or a silicon wafer. The silicon body 310 and the chip body 121 are with the same material, and the silicon body 310 is formed with a first surface 311 and a second surface 312 that are opposite to each other. The thermal conduction channels 330 are formed and parallel arranged in the silicon body 310. Each of the thermal conduction channels 330 penetrates through the silicon body 310 to connect the first surface 311 and the second surface 312 of the silicon body 310, respectively. Each of the thermal conduction channels 330 is thermally coupled to the silicon body 310 for conducting the heat energy of the working chip 120 to the heat-dissipating metal lid 210. The thermally-conductive layer 320 is disposed on the first surface 311 of the silicon body 310, and thermally coupled to the thermal conduction channels 330 and the heat-dissipating metal lid 210. For example, the thermally-conductive layer 320 is a high thermal conductivity coating layer. However, the present disclosure is not limited thereto.

In one of options, the silicon thermal conductivity element 300 is, for example, a dummy silicon chip or a failed silicon chip. More specifically, the silicon thermal conductivity element 300 is structurally similar to the working chip 120, and their working circuits are electrically isolated from each other. Each of the thermal conduction channels 330 is, for example, a TSV (Through Silicon Via) conducting portion.

Figure 3:
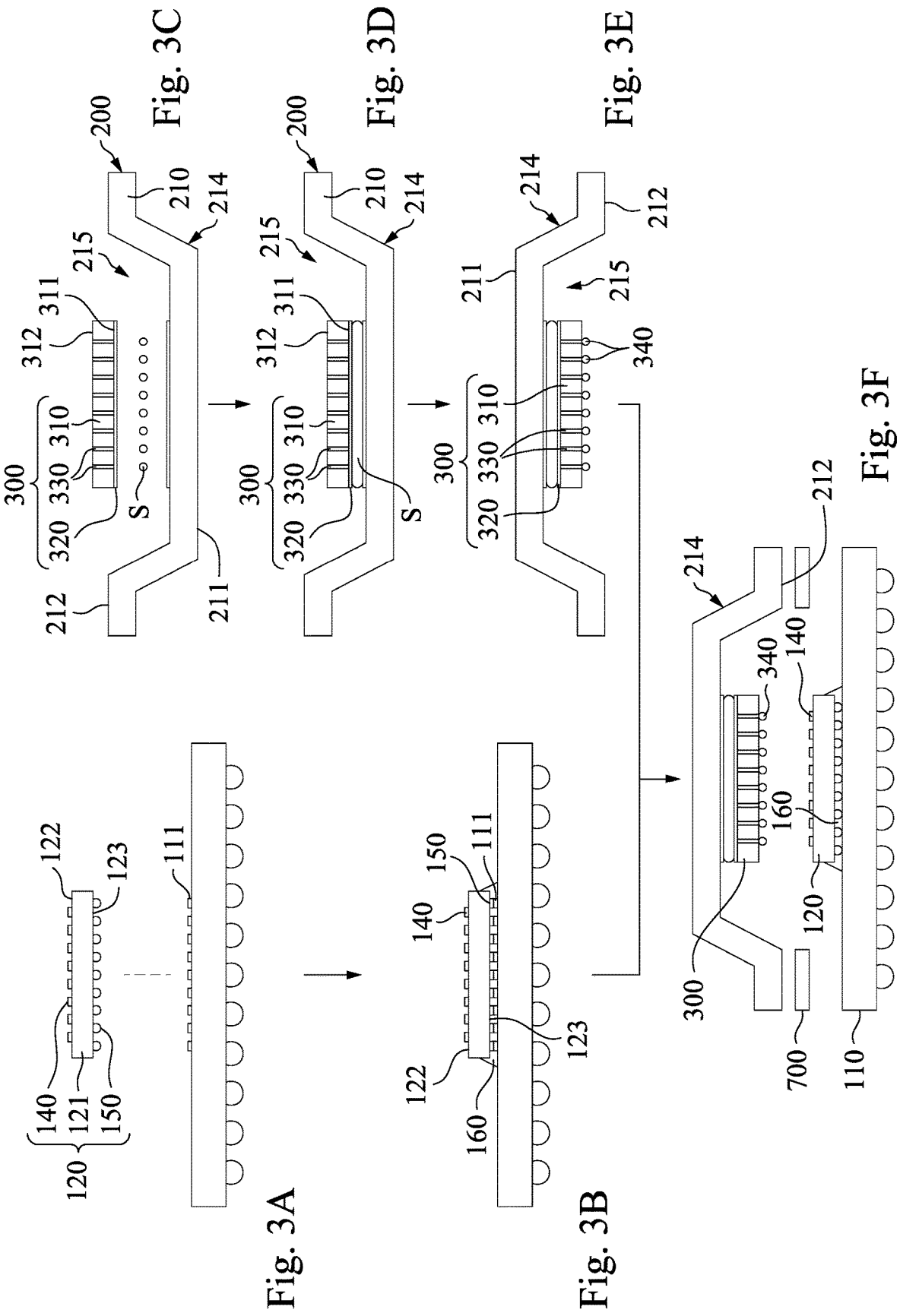
FIG. 3A to FIG. 3F respectively are continuous operational schematic views of the manufacturing method of FIG. 2.

Furthermore, the silicon thermal conductivity element 300 further includes a plurality of first solder bumps 340. The first solder bumps 340 are spaced arranged on the second surface 312 of the silicon body 310 and between the silicon body 310 and the chip body 121. Each of the first solder bumps 340 is fixedly connected to one of the thermal conduction channels 330, respectively. However, the present disclosure is not limited thereto. In other embodiments, the number of the first solder bumps 340 may also be single, so as to fixedly connect to all of the thermal conduction channels 330 together. The chip body 121 is formed with a third surface 122 and a fourth surface 123 which are opposite to each other. The chip body 121 includes a plurality of second solder bumps 140 and a plurality of solder balls 150. The second solder bumps 140 are respectively spaced arranged on the third surface 122 of the chip body 121, and soldered to the first solder bumps 340. It is noted, the second solder bumps 140 are still electrically isolated from the working circuit within the chip body 121. The solder balls 150 are spaced arranged on the fourth surface 123 of the chip body 121. The solder balls 150 are electrically connected to the working circuit of the working chip 120, and are soldered to a plurality of solder joints 111 of the wiring board 110 (FIG. 3A). However, the disclosure is not limited thereto, in other embodiments, the second solder bump 140 can be single in number.

The heat-dissipating metal lid 210 includes a first lid body 211, a raised portion 214 and a recess portion 215. The first lid body 211 includes an inner surface 212 and an outer surface 213 which are opposite to each other. The raised portion 214 is convexly formed on the outer surface 213 of the first lid body 211, that is, the raised portion 214 protrudes towards the outer surface 213 of the first lid body 211 from the inner surface 212 of the first lid body 211. The recess portion 215 is formed on the inner surface 212 of the first lid body 211, and disposed in the raised portion 214 for accommodating the working chip 120 and the silicon thermal conductivity element 300. Furthermore, the first lid body 211 is provided with a flange 216. More specifically, the flange 216 is in a square-ringed shape, and completely surrounds the recess portion 215. The inner surface 212 of the flange 216 of the first lid body 211 is fixedly connected to the wiring board 110. However, in other embodiment, the raised portion 214 of the heat-dissipating metal lid 210 can also be omitted in the disclosure.

Figure 2:
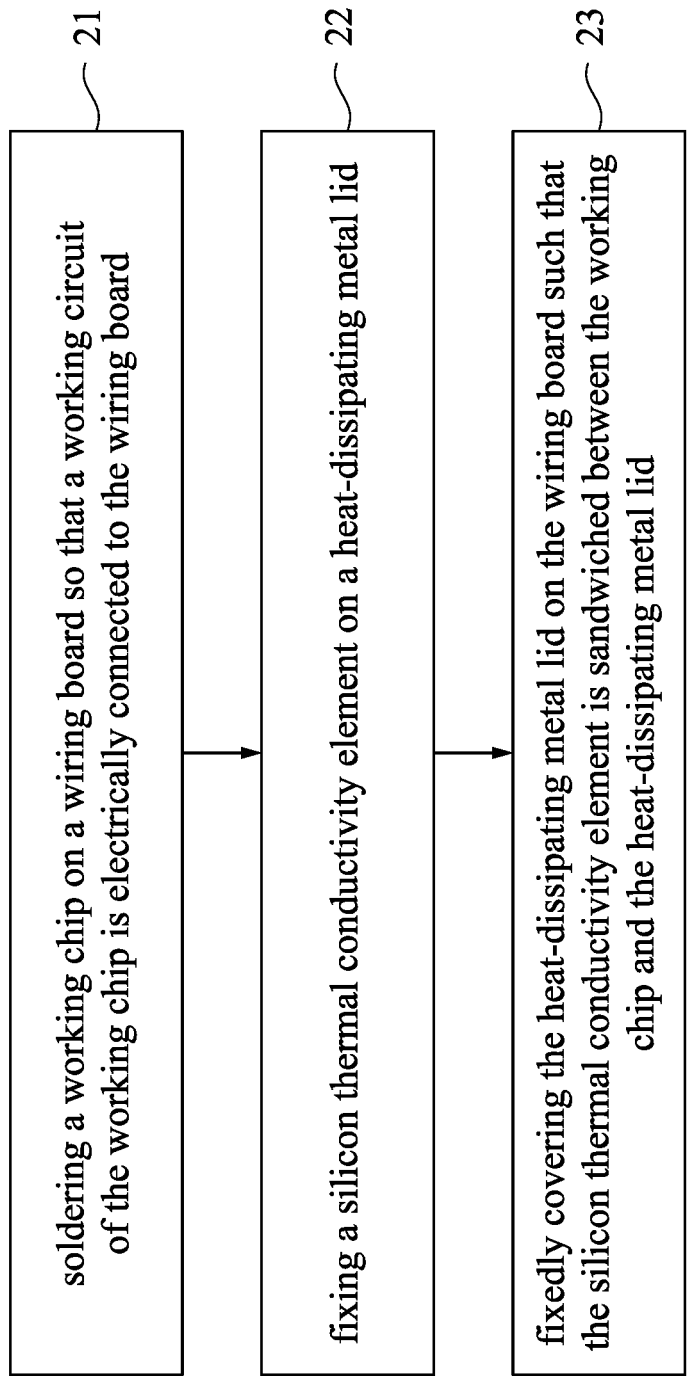
FIG. 2 is a flow chart of a manufacturing method of a semiconductor packaging device of FIG. 1.

FIG. 2 is a flow chart of a manufacturing method of a semiconductor packaging device 10 of FIG. 1. As shown in FIG. 1 and FIG. 2, the manufacturing method of the semiconductor packaging device 10 includes Step 21 to Step 23. In Step 21, the working chip 120 is soldered on the wiring board 110 so that the working circuit of the working chip 120 is electrically connected to the wiring board 110. In Step 22, the silicon thermal conductivity element 300 is fixedly connected to the heat-dissipating metal lid 210. In Step 23, the heat-dissipating metal lid 210 is fixedly covered on the wiring board 110 such that the silicon thermal conductivity element 300 is sandwiched between the working chip 120 and the heat-dissipating metal lid 210.

It is noted, Step 21 and Step 22 in the embodiment can be performed simultaneously, however, the disclosure is not limited thereto. In other embodiments, Step 21 and Step 22 may also be modified to be performed sequentially.

FIG. 3A to FIG. 3F respectively are continuous operational schematic views of the manufacturing method of FIG. 2. As shown in FIG. 3A to FIG. 3B, the step 21 described above further includes several detailed steps as follows. The solder balls 150 of the working chip 120 are respectively soldered to the solder joints 111 of the wiring board 110, so that the working circuit of the working chip 120 can be electrically connected to the wiring board 110 through the solder balls 150; next, a first filling layer 160 is filled to be sandwiched between the working chip 120 and the wiring board 110, such that the first filling layer 160 surrounds the solder balls 150 and the solder joints 111 for protecting the solder balls 150 and the solder joints 111. For example, the first filling layer 160 includes epoxy resin or other similar material, however, the disclosure is not limited to this.

As shown in FIG. 3C to FIG. 3E, the step 22 described above further includes several detailed steps as follows. The thermally-conductive layer 320 of the silicon thermal conductivity element 300 is soldered to the inner walls of the recess portion 215 of the heat-dissipating metal lid 210 through solder materials S (FIG. 3C to FIG. 3D). Next, the heat-dissipating metal lid 210 is flipped to be upside down, and the first solder bumps 340 are then fixedly connected to the thermal conduction channels 330 one on one (FIG. 3E).

As shown in FIG. 3E to FIG. 3F, the step 23 described above further includes several detailed steps as follows. The inner surface 212 of the first lid body 211 is fixedly adhered on the wiring board 110 through an adhesive 700 such that the silicon thermal conductivity element 300 is sandwiched between the working chip 120 and the heat-dissipating metal lid 210. Next, the first solder bumps 340 of the silicon thermal conductivity element 300 are soldered on the second solder bumps 140 of the working chip 120 so that the working chip 120 can thermally exchange with the heat-dissipating metal lid 210 through the silicon thermal conductivity element 300, and the wiring board 110 can thermally exchange with the heat-dissipating metal lid 210 through the adhesives 700 (FIG. 1). Next, a second filling layer 350 is filled to be sandwiched between the working chip 120 and the silicon thermal conductivity element 300, and fully filled into a gap formed among the first solder bumps 340 and the second solder bumps 140 so that the second filling layer 350 collectively surrounds the first solder bumps 340 and the second solder bumps 140 for protecting the first solder bumps 340 and the second solder bumps 140 (FIG. 1). For example, the second filling layer 350 includes epoxy resin or other similar material, however, the disclosure is not limited thereto.

It is noted, if the chip body 121 includes a solderable material, the first solder bumps 340 of the silicon thermal conductivity element 300 can be directly soldered on the surface of the chip body 121. Therefore, the chip body 121 is not necessary to be provided with the second solder bump 140.

In the embodiment, as shown in FIG. 1, when the conventional device without the silicon thermal conductivity element and the semiconductor packaging device 10 of this embodiment are performed in a thermal simulation experiment within one system (including a heat dissipation module), the simulated junction temperature of the conventional device without the silicon thermal conductivity element is 88.98° C., and the simulated junction temperature of the semiconductor packaging device 10 is 84.57° C., and the simulated conditions are that the ambient temperature is 30.0° C., the temperature of a fan inlet is 36.0° C., and the fan speed of the fan is 6700 (RPM).

Figure 4:
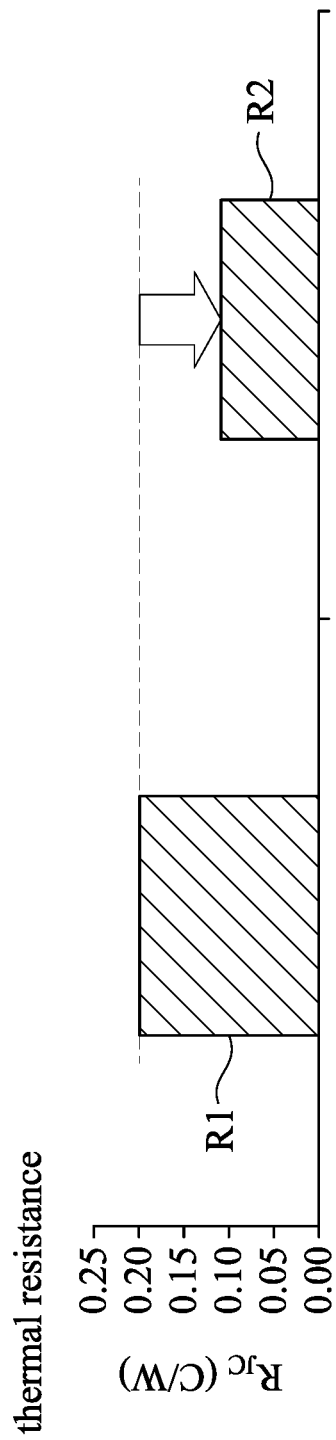
FIG. 4 is a thermal-resistance variation diagram showing the semiconductor packaging device of FIG. 1 and a conventional device.

FIG. 4 is a thermal-resistance variation diagram showing the semiconductor packaging device 10 of FIG. 1 and a conventional device. As shown in FIG. 4, it can be told from the results of the thermal simulation that the thermal resistance R2 of the semiconductor packaging device 10 having the silicon thermal conductivity element 300 can be dramatically reduced by about 45% comparing to the thermal resistance R1 of the conventional device without the silicon thermal conductivity element is approximate to 0.2.

Figure 5:
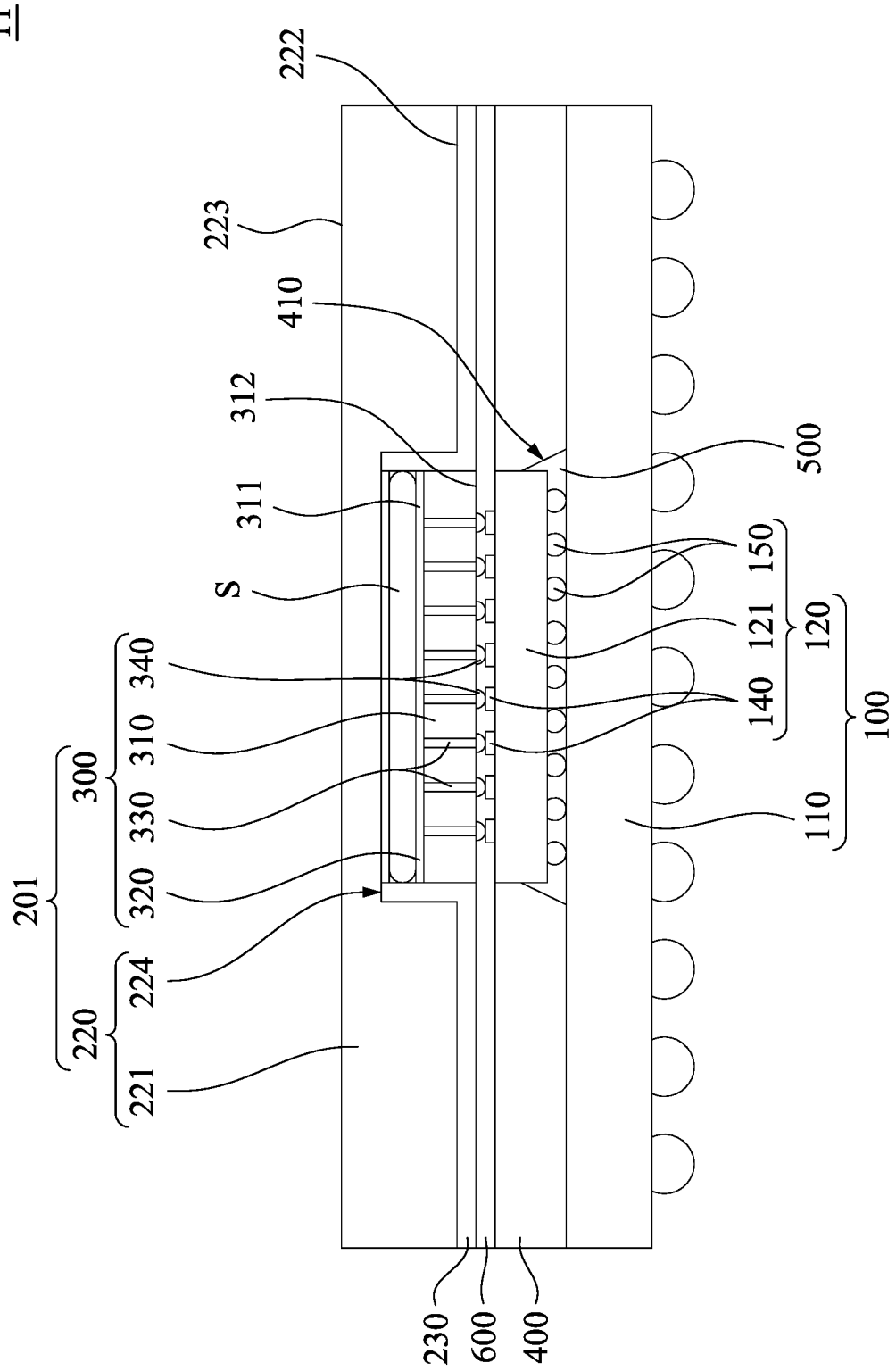
FIG. 5 is a schematic view of a semiconductor packaging device according to one embodiment of the present disclosure.

FIG. 5 is a schematic view of a semiconductor packaging device 11 according to one embodiment of the present disclosure. As shown in FIG. 5, the semiconductor packaging device 11 of the embodiment is substantially the same to the semiconductor packaging device 10 of FIG. 1, except that the heat-dissipating metal lid 220 of the heat dissipation structure 201 includes a second lid body 221 and a recess portion 224. The second lid body 221 includes an inner surface 222 and an outer surface 223 which are opposite to each other. The recess portion 224 is formed on the inner surface 222 of the second lid body 221, and recessed towards the outer surface 223 of the second lid body 221 from the inner surface 222 of the second lid body 221 for accommodating the silicon thermal conductivity element 300. The recess portion 224 is not convexly formed on the outer surface 223 of the second lid body 221. In addition, the second lid body 221 is in a flat plate shape. The inner surface 222 of the second lid body 221 totally surrounds the recess portion 224, and is fixedly connected to the wiring board 110 indirectly.

The semiconductor packaging device 11 further includes a protective layer 230. A part of the protective layer 230 completely covers the inner surface 222 of the second lid body 221 and the recess portion 224, and another part of the protective layer 230 is also filled into the recess portion 224 to wrap the silicon thermal conductive element 300 within the recess portion 224. The semiconductor packaging device 11 further includes an encapsulation material 400, a third filling layer 500 and a fourth filling layer 600. The encapsulation material 400 is sandwiched between the second lid body 221 and the wiring board 110, and the encapsulation material 400 surrounds the working chip 120 so as to form a middle opening 410 therein. In other words, the above-mentioned working chip 120 is received within the middle opening 410, and disposed outside the recess portion 224 of the heat-dissipating metal lid 220. The third filling layer 500 is filled into the middle opening 410, and filled into a gap collectively formed by the encapsulation material 400, the working chip 120 and the wiring board 110. The fourth filling layer 600 is filled to be sandwiched between the protective layer 230 and the encapsulation material 400. For example, the encapsulation material 400 includes epoxy resin or other similar material; each of the third filling layer 500 and the fourth filling layer 600 includes rubber, silicone or other similar material, and the protective layer 230 includes resin molding materials or other similar material, however, the disclosure is not limited thereto.

Figure 6D:
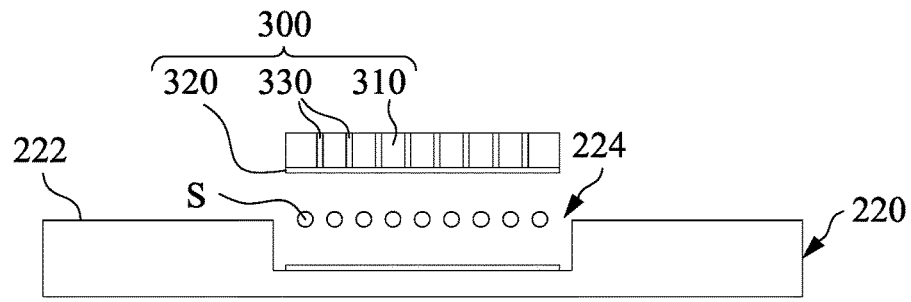

FIG. 6A to FIG. 6I respectively are continuous operational schematic views of the manufacturing method of FIG. 5. As shown in FIG. 6A to FIG. 6C, the step 21 described above further includes several detailed steps as follows. The solder balls 150 of the working chip 120 are respectively soldered to the solder joints 111 of the wiring board 110, so that the working circuit of the working chip 120 is electrically connected to the wiring board 110 through the solder balls 150 (FIG. 6A and FIG. 6B). Next, a third filling layer 500 is filled to be sandwiched between the working chip 120 and the wiring board 110, such that the third filling layer 500 surrounds the solder balls 150 and the solder joints 111 for protecting the solder balls 150 and the solder joints 111 (FIG. 6B). Next, an encapsulation material 400 is coated to form on one surface of the wiring board 110 to surround the aforementioned working chip 120 and the third filling layer 500 (FIG. 6C).

Figure 6E:
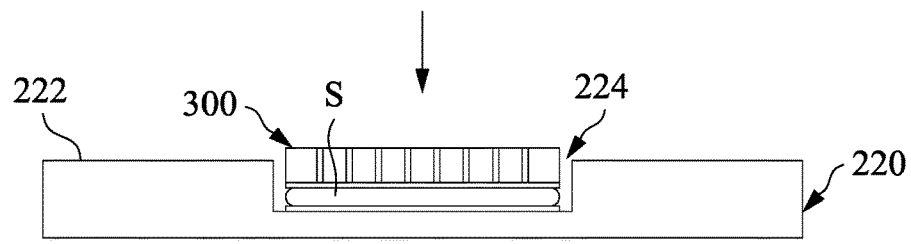
Figure 6F:
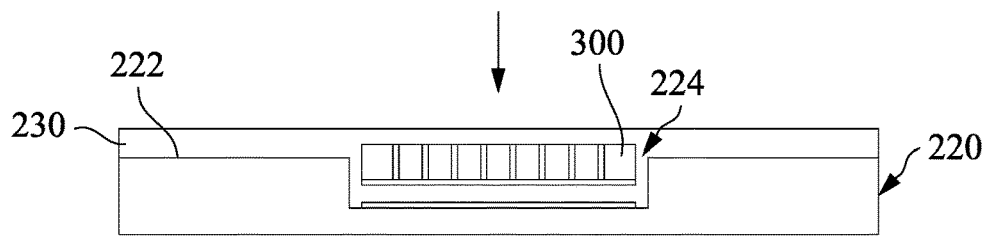
Figure 6G:
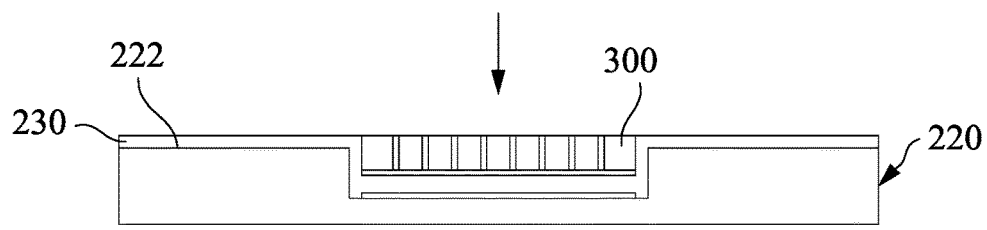
Figure 6H:
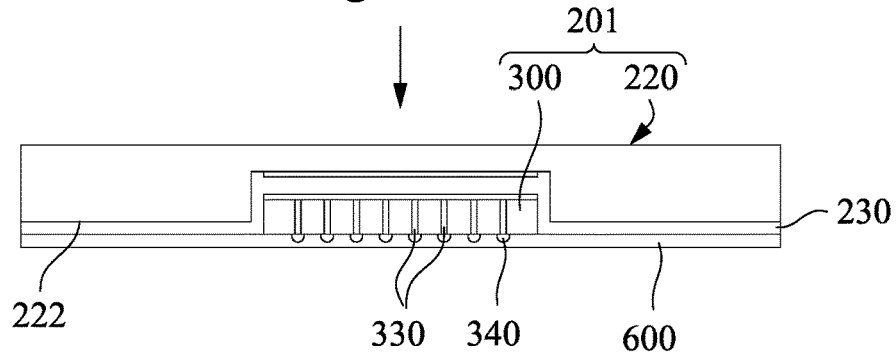

As shown in FIG. 6D to FIG. 6H, the step 22 described above further includes several detailed steps as follows. The thermally-conductive layer 320 of the silicon thermal conductivity element 300 is soldered to the inner walls of the recess portion 224 of the heat-dissipating metal lid 220 through solder materials S (FIG. 6D to FIG. 6E). Next, a protective layer 230 is coated onto the inner surface 222 of the heat dissipation structure 200 and the silicon thermal conductivity element 300 received within the recess portion 224 (FIG. 6F). Next, one surface of the protective layer 230 being opposite to the heat-dissipating metal lid 220 is grinded so as to remove a part of the protective layer 230, accordingly, the thermal conduction channels 330 of the silicon thermal conductivity element 300 are exposed outwards from one surface of the protective layer 230 which is previously grinded (FIG. 6G). Next, the heat-dissipating metal lid 220 is flipped to be upside down, and the first solder bumps 340 are then fixedly connected to the thermal conduction channels 330 one on one (FIG. 6H).

As shown in FIG. 6H, the step 22 described above further includes several detailed steps as follows. A fourth filling layer 600 is formed on the protective layer 230 and the silicon thermal conductivity element 300 so that the fourth filling layer 600, the protective layer 230 and the silicon thermal conductivity element 300 are formed to be the aforementioned heat dissipation structure 201.

Figure 6I:
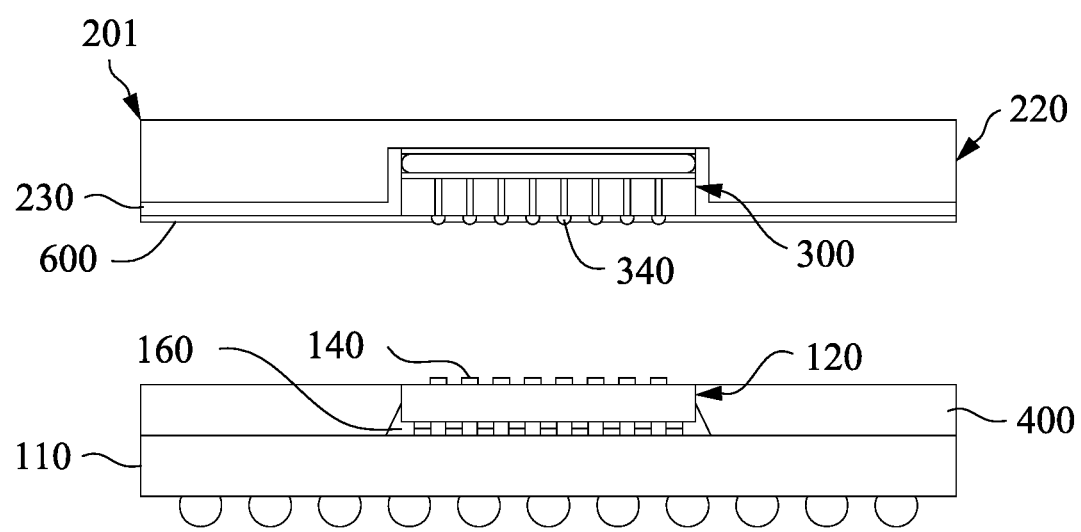

As shown in FIG. 5 and FIG. 6I, the step 23 described above further includes several detailed steps as follows. The heat dissipation structure 201 is covered on one side of the encapsulation material 400 opposite to the wiring board 110 and one side of the working chip 120 opposite to the wiring board 110 such that the silicon thermal conductivity element 300 is sandwiched between the working chip 120 and the heat-dissipating metal lid 220 (FIG. 5). Next, the first solder bumps 340 of the silicon thermal conductivity element 300 are soldered on the second solder bumps 140 of the working chip 120 so that the working chip 120 can thermally exchange with the heat-dissipating metal lid 220 through the silicon thermal conductivity element 300.

It is noted, if the chip body 121 includes a solderable material, the first solder bumps 340 of the silicon thermal conductivity element 300 can be directly soldered on the surface of the chip body 121. Therefore, the chip body 121 is not necessary to be provided with the second solder bump 140.

In the embodiment, as shown in FIG. 5, when the conventional device without the silicon thermal conductivity element and the semiconductor packaging device 11 of this embodiment are performed in a thermal simulation experiment within one system (including a heat dissipation module), the simulated junction temperature of the conventional device without the silicon thermal conductivity element is 88.98° C., and the simulated junction temperature of the semiconductor packaging device 11 is 82.07° C., and the simulated conditions are that the ambient temperature is 30.0° C., the temperature of a fan inlet is 36.0° C., and the fan speed of the fan is 6700 (RPM).

Figure 7:
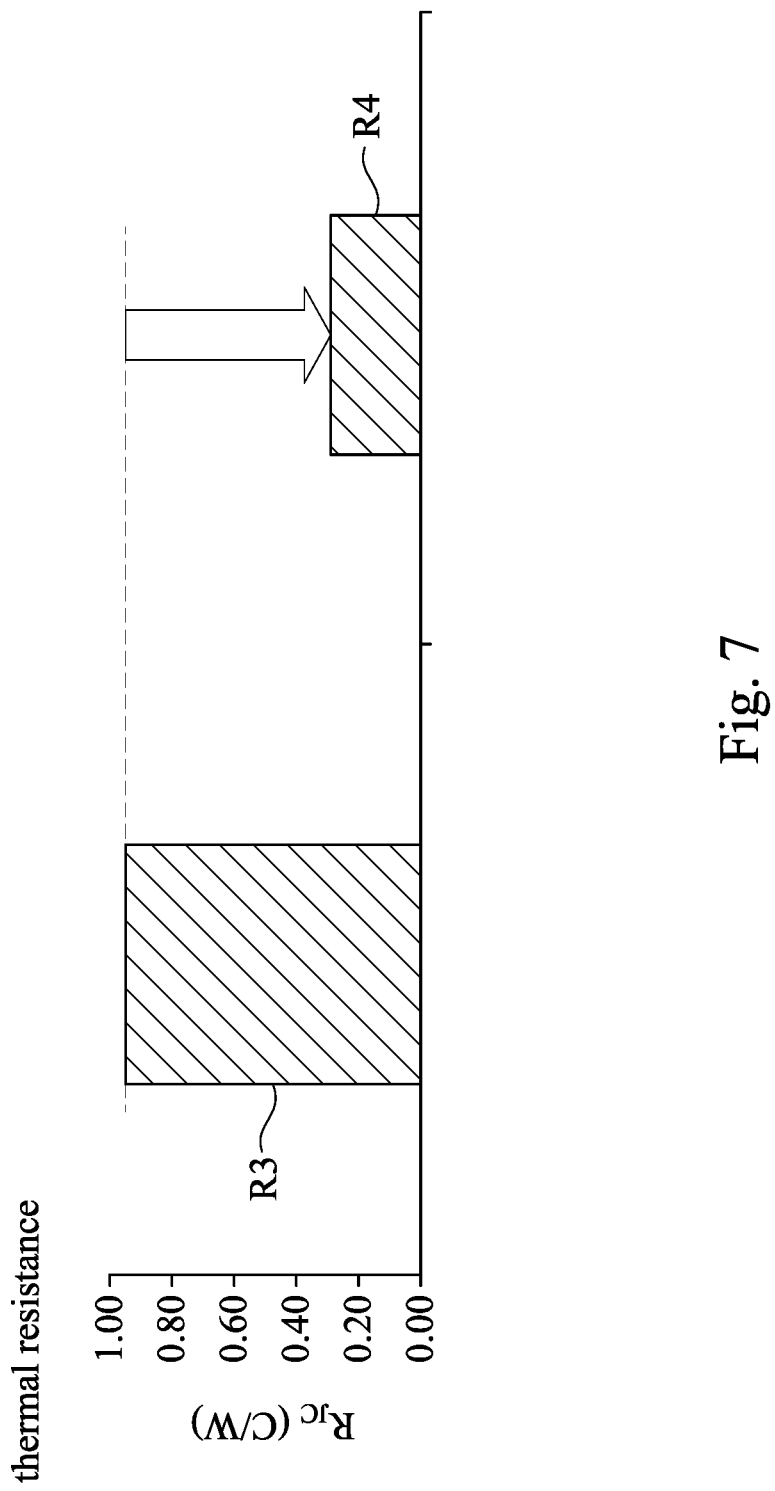
FIG. 7 is a thermal-resistance variation diagram showing the semiconductor packaging device of FIG. 5 and a conventional device.

FIG. 7 is a thermal-resistance variation diagram showing the semiconductor packaging device 11 of FIG. 5 and a conventional device. As shown in FIG. 7, it can be told from the results of the thermal simulation that the thermal resistance R4 of the semiconductor packaging device 11 having the silicon thermal conductivity element 300 can be dramatically reduced by about 65% comparing to the thermal resistance R3 of the conventional device without the silicon thermal conductivity element is approximate to 1.0.

Thus, through the construction of the embodiments above, the present disclosure is able to improve the thermal conductivity of the thermal conductivity interface between the working chip and the heat-dissipating metal lid, so that the heat dissipation performance of the semiconductor packaging device can be effectively improved and thermal resistance of the semiconductor packaging device is reduced.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:
1. A heat dissipation structure, comprising:
 a heat-dissipating metal lid comprising a lid body and a recess portion that is formed on one surface of the lid body for accommodating a heat source, and a protective layer covering the one surface of the lid body and the recess portion;
 an encapsulation material disposed on the protective layer, and surrounding the heat source;
 a filling layer filled between the protective layer and the encapsulation material, and between the protective layer and the heat source; and
 a dummy silicon chip mounted within the recess portion, such that one of two opposite sides of the dummy silicon chip is fixedly connected to the heat-dissipating metal lid, and the other of the opposite sides of the dummy silicon chip is thermally coupled to the heat source, and electrically isolated from the heat source, wherein the protective layer wraps the dummy silicon chip in the recess portion.

2. The heat dissipation structure of claim 1, wherein the heat dissipation structure comprising:
 a silicon body formed with a first surface and a second surface which are opposite to each other;
 a plurality of thermal conduction channels formed inside the silicon body, and arranged abreast in the silicon body, wherein each of the thermal conduction channels penetrates through the silicon body and connects the first surface and the second surface of the silicon body, respectively;
 a thermally-conductive layer disposed on the first surface of the silicon body, and fixedly connected to the thermal conduction channels and the heat-dissipating metal lid; and
 a plurality of solder bumps spaced arranged on the second surface of the silicon body, wherein each of the solder bumps is soldered to one of the thermal conduction channels for fixedly connecting to the heat source.

3. The heat dissipation structure of claim 1, wherein the dummy silicon chip comprises silicon carbide.

4. A semiconductor packaging device, comprising:
 a wiring board;
 a working chip comprising a chip body fixedly mounted on the wiring board, and an working circuit inbuilt inside the chip body, and electrically connected to the wiring board, wherein the chip body is formed with a third surface and a fourth surface which are opposite to each other, and the chip body comprising a plurality of second solder bumps disposed on the third surface, and and a plurality of solder balls disposed on the fourth surface;

a heat-dissipating metal lid; and a silicon thermal conductivity element thermally coupled to the chip body and the heat-dissipating metal lid, and electrically isolated from the working circuit and the wiring board, and the silicon thermal conductivity element comprising a silicon body formed with a first surface and a second surface which are opposite to each other; a plurality of thermal conduction channels formed inside the silicon body, and arranged abreast in the silicon body, wherein each of the thermal conduction channels penetrates through the silicon body and connects the first surface and the second surface of the silicon body, respectively; a thermally-conductive layer disposed on the first surface of the silicon body, and thermally coupled to the thermal conduction channels and the heat-dissipating metal lid; and a plurality of first solder bumps disposed on the second surface of the silicon body, and thermally coupled to the thermal conduction channels, respectively, wherein the second solder bumps are respectively soldered to the first solder bumps, and electrically isolated from the working circuit, and the solder balls are electrically connected to the working circuit, and respectively soldered to a plurality of solder joints of the wiring board.

5. The semiconductor packaging device of claim 4, wherein the working chip further comprises a first filling layer, and the first filling layer is sandwiched between the chip body and the wiring board, and surrounds the solder balls of the chip body and the solder joints of the wiring board; and the silicon thermal conductivity element further comprises a second filling layer, and the second filling layer is sandwiched between the chip body and the a silicon body, and surrounds the at least one first solder bump and the at least one second solder bump.

6. The semiconductor packaging device of claim 4, wherein the heat-dissipating metal lid comprising:

a lid body comprising an inner surface and an outer surface which are opposite to each other, and the inner surface that is fixedly connected to the wiring board; and a recess portion that is formed on the inner surface of the lid body for accommodating the working chip and the silicon thermal conductivity element.

7. The semiconductor packaging device of claim 6, wherein the heat-dissipating metal lid further comprising:

a protective layer covering the inner surface of the lid body and the recess portion, and wrapping the silicon thermal conductivity element in the recess portion.

8. The semiconductor packaging device of claim 7, further comprising:

an encapsulation material sandwiched between the protective layer and the wiring board, and surrounding the working chip; and a filling layer disposed between the protective layer and the encapsulation material, and disposed within a gap collectively formed by the encapsulation material, the working chip and the wiring board.

9. The semiconductor packaging device of claim 4, wherein the silicon thermal conductivity element and the chip body are with same material.

* * * * *